United States Patent
Kelly

(10) Patent No.: US 11,692,955 B2
(45) Date of Patent: Jul. 4, 2023

(54) METHOD FOR DETERMINING THE DEGREE OF CURE IN FORAGES

(71) Applicant: Sipco Pty Ltd, Adelaide (AU)

(72) Inventor: Richard Kelly, Adelaide (AU)

(73) Assignee: SIPCO PTY LTD, Adelaide (AU)

( * ) Notice: Subject to any disclaimer, the term of this patent is extended or adjusted under 35 U.S.C. 154(b) by 0 days.

(21) Appl. No.: 17/048,797

(22) PCT Filed: Apr. 18, 2019

(86) PCT No.: PCT/AU2019/050352
§ 371 (c)(1),
(2) Date: Oct. 19, 2020

(87) PCT Pub. No.: WO2019/200437
PCT Pub. Date: Oct. 24, 2019

(65) Prior Publication Data
US 2021/0116403 A1    Apr. 22, 2021

(30) Foreign Application Priority Data
Apr. 20, 2018   (AU) ................ 2018901317

(51) Int. Cl.
*G01N 24/08* (2006.01)
*A23K 30/12* (2016.01)
*G01R 33/44* (2006.01)

(52) U.S. Cl.
CPC .......... *G01N 24/082* (2013.01); *A23K 30/12* (2016.05); *G01R 33/448* (2013.01)

(58) Field of Classification Search
CPC ..... A23K 30/12; G01N 24/082; G01R 33/448
See application file for complete search history.

(56) References Cited

U.S. PATENT DOCUMENTS

| | | | |
|---|---|---|---|
| 9,921,282 B2 * | 3/2018 | Collins, Sr. ............ | G01R 33/44 |
| 2005/0270023 A1 * | 12/2005 | Freedman ................ | G01V 3/32 324/303 |
| 2016/0003753 A1 * | 1/2016 | Augustine .............. | G01R 33/30 324/309 |
| 2018/0080887 A1 | 3/2018 | Bajema et al. | |

FOREIGN PATENT DOCUMENTS

WO     2016179632     11/2016

* cited by examiner

*Primary Examiner* — Jay Patidar
(74) *Attorney, Agent, or Firm* — Sand, Sebolt & Wernow Co., LPA

(57) ABSTRACT

A method for determining the degree of cure in forages using a nuclear magnetic resonance (NMR) technique. An NMR instrument is used to determine the amount of bound moisture (typically called stem moisture) and free moisture (typically called dew moisture) the degree of which can be used to determine how cured the forage is. This method represents an improvement on the traditional ways of determining how cured a forage is. The traditional ways have been by twisting a bunch of forage in ones hands or using a mechanical method (Hammer of fingernail) to determine if there is too much stem moisture in the stem nodes. The method can be applied using a portable instrument or building the instrument into a forage harvesting machine such as a hay baler.

6 Claims, 1 Drawing Sheet

$T_2$ distribution for the Lucerne hay (Ex1) sample air dried laboratory conditions.

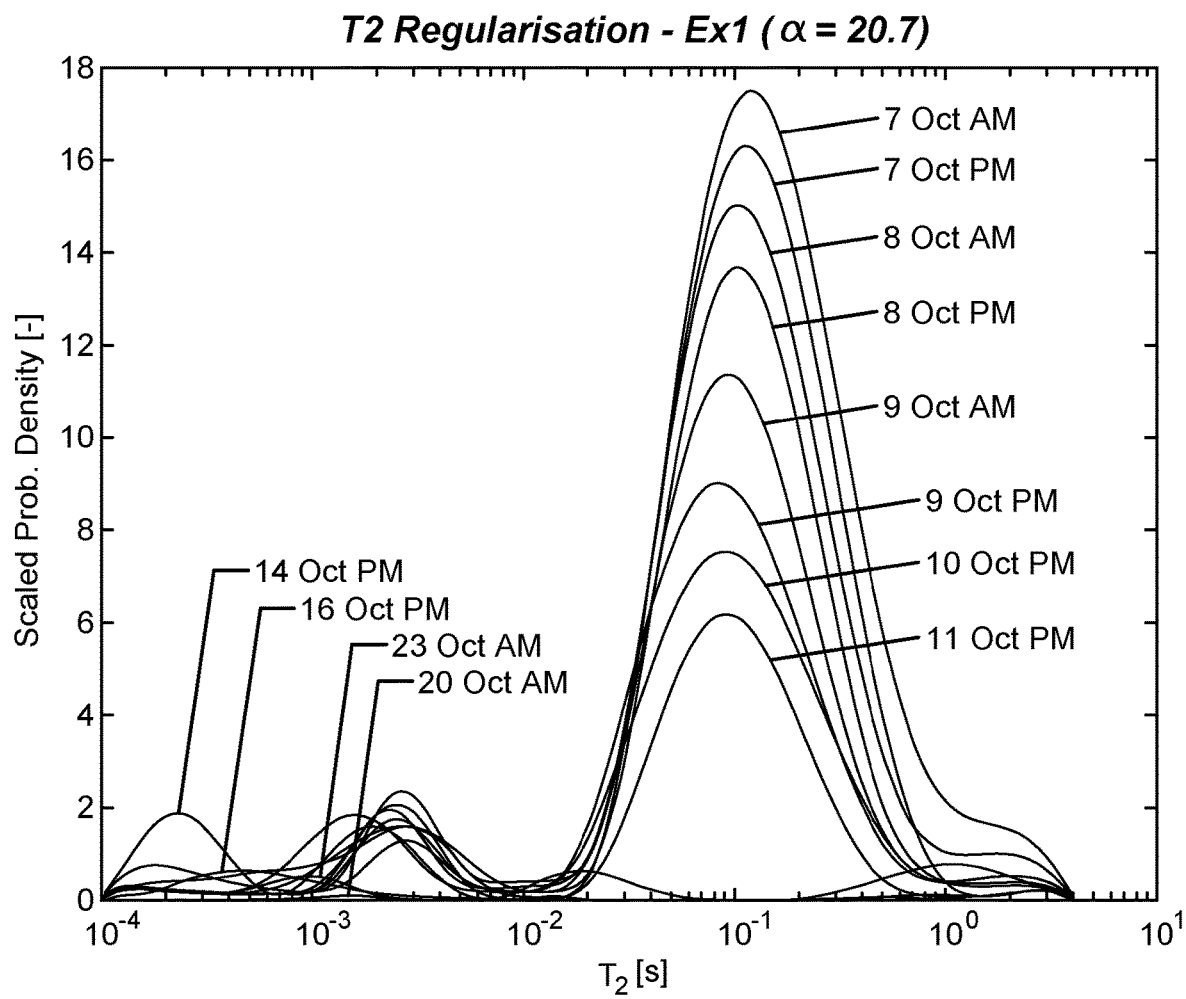
Figure 1. $T_2$ distribution for the Lucerne hay (Ex1) sample air dried laboratory conditions.

METHOD FOR DETERMINING THE DEGREE OF CURE IN FORAGES

FIELD OF THE INVENTION

The present invention relates to a method of determining the degree of cure in forage using a NMR instrument that can be mounted to a hay baler or other farming equipment.

BACKGROUND TO THE INVENTION

The primary application for the invention is the fodder (forage) industry for both hay and silage.

Silage is typically cut and stored in a silage pit using a forage harvesting machine that picks up the fodder after it is cut and chops it up fine and propels it out into a moving truck beside the forage harvester. To preserve the nutritional value in silage, it goes through an "ensiling" process which requires the actions of certain type of bacteria and moisture in an anaerobic reaction. The moisture content is usually quite high (typically 60%) which is often referred to in terms of the "dry matter". i.e. 60% moisture is 40% dry matter.

Traditionally, hay is cut and windrowed (sometimes with the same machine doing both operations concurrently) then left to dry until the hay is "cured" before baling. Sometimes it is also "conditioned" to encourage drying after windrowing, and also, may be "teddered" after windrowing to encourage drying.

"Conditioning" is the process of putting the hay though sets of ribbed rollers to crush the stems and in particular the "nodes" in the stems of cereal hay. These rollers may also be in the implement that does the windrowing as well.

"Tedding" is the process of raking up the hay and then putting it back into windrows to move the hay and turn it over to encourage drying.

The moisture in hay is of two types. "Stem moisture" and "Dew Moisture". The stem moisture is the moisture bound up inside the plant and as the plant dries, the last remaining moisture typically resides in the "nodes" of the stem. The dew moisture is the surface moisture which is on the outside of the plant caused by rain, or dew.

One of the main issues that hay farmers face if the crop is cut down and allowed to stay on the ground before baling for too long (typically 10 days or more) is the growth of yeast and moulds, typically measured as Colony Forming Units per gram (CFU's). Farmers typically refer to these as "bugs". As the bugs consume the carbohydrates (typically sugars) they convert the sugars to $CO_2$ and water. An overabundance of CFU's leads to lower nutritional value of the hay and in the worst case scenario possible spontaneous combustion.

To obtain the values of the CFU's and any other nutritional parameters of the hay, samples are taken and send to a laboratory for analysis. Typically the results take some days to receive back.

When a farmer tests to see if the hay is dry enough to bale (cured) he is mainly concerned about the internal stem moisture (the moisture that is hard to see or feel), so typically the farmer will use a physical test to see if the hay is cured. This physical process can take various forms. The most common is to hold a bunch of hay and twist it. If it breaks easily it is cured. Often a finger nail dug into a node is used, or hitting a node with hammer on a tow ball is used to see how much moisture is left in the nodes.

Manufacturers of hay balers, and in particular large square balers are making their machines ever more powerful. These machines are stronger and use more power to compress the hay which results in higher bulk densities of big square hay bales. The higher bulk densities increase the likelihood of yeasts and moulds degrading the quality of the hay, or even leading to spontaneous combustion at lower moisture levels. The traditional methods of using physical methods to test if the hay is cured needs to be replaced with an instrument which provides a more reliable measure of stem and dew moisture.

It is one intention of this invention to provide an instrument to more scientifically determine if hay is cured by measuring the bound moisture (stem moisture) and free moisture (dew moisture) independently.

Furthermore, another intention of the invention is to show when there is an increase in stem moisture unrelated to ambient weather conditions which should be a warning that the CFU's are dangerously high.

Basically the object of this invention is to provide a more scientific method to alleviate the above difficulties, or at least provide the public with a useful alternative.

SUMMARY OF THE INVENTION

In a first aspect the invention comprises a method using the spin-spin relaxation time (T2) of hydrogen protons to determine the relative quantity of bound moisture and free moisture to further determine the degree of cure of forage.

In preference by calculating the change in bound moisture with time allows one to determine the likelihood of excessive Colony Forming Units per gram.

In preference by measuring an earlier T2 relaxation signal one can calculate the total bulk mass of the sample under test.

It should be noted that any one of the aspects mentioned above may include any of the features of any of the other aspects mentioned above and may include any of the features of any of the embodiments described below as appropriate.

BRIEF DESCRIPTION OF THE DRAWINGS

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way. The Detailed Description will make reference to a number of drawings as follows.

FIG. 1 is a plot of the moisture content of a sample of fodder measured over different days.

DETAILED DESCRIPTION OF THE INVENTION

The following detailed description of the invention also refers to the accompanying drawing.

Nuclear magnetic resonance techniques have been used in laboratories, hospitals (MRI), industry and field research for many years, including the use of one-sided access instruments that this new innovative application is based upon using. The Carr-Purcell-Meiboom-Gill sequence (CPMG) experiment allows one to measure transverse or spin-spin $T_2$ relaxation times of any nucleus. The precessional path around the magnetic field is circular like a spinning top. The Larmor or precessional frequency in NMR refers to the rate of precession of the magnetic moment of the proton around the external magnetic field.

The use of CPMG pulse trains to determine the T2 curve is well known to those skilled in the art, as is using driven equilibrium pulse techniques to speed up the data acquisition in situations like drill hole wire line logging.

There are a number of NMR instruments that have been designed in the past using permanent magnets. Such instruments include Halbach magnet arrays where the sample is presented inside the array and one-sided access instruments where, as the name implies, the sample is presented to the side of the instrument This invention uses the way the information from the NMR T2 curve to determine how cured the forage is. As the yeast and moulds consume the carbohydrates (typically sugars) they produce water and $CO_2$ as by products.

This method can determine the possibility of excessive yeast and moulds by examining the changing levels of stem moisture with time. Given no external environmental factors that may affect stem moisture levels, the detection of rising stem moisture levels may be used as an indicator that the yeast and mould levels are dangerously high. Actions such as applying additive to hay to prevent spontaneous combustion, or baling at much lower moisture levels than normal may then be applied to mitigate the likelihood of spontaneous combustion.

Typically the present application is carried out using an instrument in the field or purpose build into a machine such as a hay baler. Because of the relatively high magnetic field strengths used in instruments that may be used for the inventive application, the measurement volume should be protected to minimise the risk of the magnetic fields affecting electronic devices or injury from persons using ferromagnetic tools. A farmer may use a portable instrument in a farm vehicle which may be used to regularly check moisture levels of samples of hay in the windrow.

The advantage of this inventive application is that it takes away one of the very nebulous traditional methods of determining when hay in the windrow is ready to bale and replaces it with a scientific instrument with better accuracy and repeatability. This also means that results from many applications of the technique can be compared across many types of crops, soil types, weather conditions and other environmental conditions thus enabling hay baling operators to improve their timing of when to bale hay based on sound instrumental evidence.

The exact values of the stem to dew moisture ratios or the independent values of these parameters to determine how cured a forage is based upon empirical data. Once the data is collected it allows the user to compare the measured parameters with those in the tables to determine the moisture levels of the forage.

Although the physical form of the instrument proposed for this innovative application is the one-sided access NMR, the same innovative application can be carried out with any other form of NMR instrument. The choice of a one-sided access NMR as the preferred embodiment of this innovative application is because the perceived primary application is to have the instrument built into the hay baler at the point of manufacture.

Whilst different Larmor frequencies could be used, the typical frequencies used are likely to be 2 Megahertz and above. A preferred embodiment of the instrument is 4 Megahertz as the higher frequency provides a superior signal to noise ratio.

Referring now to FIG. 1, the bound or stem moisture signal in a typical CPMG pulse sequence run resides under the T2 curve at under 100 milliseconds. The free or dew moisture resides under the T2 curve at greater than 100 milliseconds. By examining these times the user can determine how cured the forage is. The results in FIG. 1 were obtained using a commercial 2 MHz Halbach magnet array instrument.

The reader will now appreciate the use of an NMR instrument of any suitable magnetic field arrangement configured as a stand-alone laboratory or field use instrument or a one-sided access NMR instrument build into a hay baler at manufacture. This enables the user, typically a farmer, to determine whether or not the hay is sufficiently cured to bale it.

The samples of hay which are to be analysed by the method described herein should be representative of the area of the field that is to be baled. The method and apparatus to collect the hay samples is not part of the scope of this document. However, it is reasonable to assume that one needs to take into consideration the expected moisture variability of the field of hay which may be due to the lay of land and or wind disrupters such as tree groves to determine the number of randomly selected samples to represent the field of hay.

Thus the method provides to those who require quantitative information about the degree of cure in hay samples by means of a mobile Nuclear Magnetic Resonance instrument that is of a design that can be transported in and around hay producing areas and provide an independent measure of the bound (stem) moisture and free (dew) moisture in hay samples.

Such a nuclear magnetic resonance instrument can be mounted to or built into a mobile farm machine such as a hay baler to provide the operator quantitative information about the degree of cure in the hay in near real time.

Further advantages and improvements may very well be made to the present invention without deviating from its scope. Although the invention has been shown and described in what is conceived to be the most practical and preferred embodiment, it is recognized that departures may be made therefrom within the scope of the invention, which is not to be limited to the details disclosed herein but is to be accorded the full scope of the claims so as to embrace any and all equivalent devices and apparatus. Any discussion of the prior art throughout the specification should in no way be considered as an admission that such prior art is widely known or forms part of the common general knowledge in this field.

In the present specification and claims (if any), the word "comprising" and its derivatives including "comprises" and "comprise" include each of the stated integers but does not exclude the inclusion of one or more further integers.

The invention claimed is:

1. A method comprising:
    using a portable Nuclear Magnetic Resonance (NMR) instrument which measures a spin-spin relaxation time (T2) of hydrogen protons to determine a quantity of bound moisture and free moisture in forage to determine a degree of cure of the forage;
    wherein the forage is hay;
    wherein the method is performed in situ in a field of hay which is due to be baled;
    wherein the method is performed prior to a start of a baling operation utilizing a hay baler;
    wherein the method includes presenting a sample of hay from the field of hay to the portable NMR instrument for testing;
    independently measuring the quantity of bound moisture and free moisture in the sample of hay with the NMR instrument;

measuring the bound moisture of the hay over time;
plotting T2 curves for the bound moisture over time;
determining a trend in Colony Forming Units (CFUs) per gram of the hay over time from the T2 curves;
using the trend in CFUs per gram of the hay over time and determining a likelihood of spontaneous combustion of the hay if baled; and
performing the baling operation with the hay baler when the quantity of bound moisture and free moisture is at a level where the hay is unlikely to spontaneously combust.

2. The method according to claim 1, further comprising:
applying an additive to the hay to be baled to prevent spontaneous combustion of the hay.

3. The method according to claim 1, further comprising operating the portable NMR instrument at a frequency of one of 2 Megahertz and above 2 Megahertz.

4. The method according to claim 3, further comprising operating the portable NMR instrument at a frequency of 4 Megahertz.

5. The method according to claim 1, wherein the portable NMR instrument is a one side access Nuclear Magnetic Resonance (NMR) instrument; and the method further comprises:
mounting the one-sided access NMR instrument on the hay baler.

6. The method according to claim 1, wherein the NMR instrument provides an operator of the hay baler with quantitative information about the degree of cure of the hay in near real time.

* * * * *